(12) United States Patent
Kawano (10) Patent No.: US 6,660,617 B2
(45) Date of Patent: Dec. 9, 2003

(54) METHOD FOR FABRICATING A SEMICONDUCTOR DEVICE

(75) Inventor: Hiroyuki Kawano, Miyazaki (JP)

(73) Assignee: Oki Electric Industry CO, Ltd., Tokyo (JP)

(*) Notice: Subject to any disclaimer, the term of this patent is extended or adjusted under 35 U.S.C. 154(b) by 45 days.

(21) Appl. No.: 09/899,175

(22) Filed: Jul. 6, 2001

(65) Prior Publication Data

US 2002/0090793 A1 Jul. 11, 2002

(30) Foreign Application Priority Data

Nov. 20, 2000 (JP) ............................. 2000-352714

(51) Int. Cl.[7] .................................... H01L 21/76
(52) U.S. Cl. ....................... 438/481; 438/462
(58) Field of Search .................. 438/401, 462, 438/800; 257/797; 148/33.2

(56) References Cited

U.S. PATENT DOCUMENTS 5,786,260 A * 7/1998 Jang et al. ......... 148/DIG. 102
5,923,996 A * 7/1999 Shih et al. ................. 438/108
6,004,405 A * 12/1999 Oishi et al. ............... 148/33.2

* cited by examiner

Primary Examiner—Craig Thompson
(74) Attorney, Agent, or Firm—Rabin & Berdo, P.C.

(57) ABSTRACT

A semiconductor device having an STI structure is provided by eliminating a problem of insufficient polishing of an insulating film on chips adjacent to a marking region by making a polishing pressure equal for all of the chips. A method for fabricating a semiconductor device having an isolation structure of the present invention includes: processing a marking region of a wafer having a device region, a grid line region and the marking region in order to enable a substantially equal polishing pressure to be applied to chips adjacent to the marking region of the wafer and to other chips, for example, by tapering or recessing; marking in the marking region; forming a nitride film and an oxide film on a surface of the wafer; removing the oxide film by polishing; and removing the nitride film.

12 Claims, 7 Drawing Sheets

FIG.1A

DEVICE REGION | G/L | MARKING
(ADJACENT | REGION | REGION
EFFECTIVE
CHIPS)

FIG.2B (EARLY STAGE OF POLISHING)

FIG.2C (MIDDLE STAGE OF POLISHING)

FIG.2D (LATE STAGE OF POLISHING)

FIG.3B (EARLY STAGE OF POLISHING)

FIG.3C (MIDDLE STAGE OF POLISHING)

FIG.3D (LATE STAGE OF POLISHING)

FIG. 4C  (EARLY STAGE OF POLISHING)

FIG. 4D  (MIDDLE STAGE OF POLISHING)

FIG. 4E  (LATE STAGE OF POLISHING)

DEVICE REGION | G/L REGION | MARKING REGION

FIG. 7B (EARLY STAGE OF POLISHING)

FIG. 7C (MIDDLE STAGE OF POLISHING)

FIG. 7D (LATE STAGE OF POLISHING)

FIG. 7E   RESIDUAL SiO/SiN

METHOD FOR FABRICATING A SEMICONDUCTOR DEVICE

BACKGROUND OF THE INVENTION

1. Field of the Invention

The present invention relates to a method for fabricating a semiconductor device, and particularly to a method for isolating individual devices. More particularly, the present invention relates to a method for fabricating a semiconductor device which has good polishing characteristics for a STI (Shallow Trench Isolation) method which forms isolating regions using a CMP (Chemical Mechanical Polishing) method.

2. Description of the Related Art

In recent years, semiconductor devices are becoming more highly integrated and individual elements are becoming finer. Individual elements in a semiconductor device are isolated from one another by an insulator filled in shallow trenches formed in a semiconductor substrate. This is a so-called STI method. Various processes are known for the STI method. For example, such a process is known in which: (i) a silicon oxide film and a silicon nitride film are sequentially laminated on a silicon wafer; (ii) the silicon nitride film and the silicon oxide film are sequentially etched to form a pattern using a resist pattern for photolithography as a mask; (iii) trenches are etched in the silicon substrate; (iv) a thermal oxide film is formed on inner walls of the trenches by thermal oxidation; (v) an oxide film is formed on the entire surface of the silicon wafer by a CVD method so that the trenches are filled with the oxide film; (vi) the oxide film formed on the silicon nitride film is removed by the CMP method using the silicon nitride film as a stopper in order to leave the oxide film only in the trenches; and (vii) the silicon nitride film is removed using hot phosphoric acid.

A wafer usually has a marking region besides a device region (effective chip region), and a wafer history is marked in this marking region by printing or the like. The marking is carried out, for example, by a laser. After this marking, the process of the STI method is carried out as described above (formation of the nitride film and the oxide film, and the CMP and the like thereafter).

Figure 6:
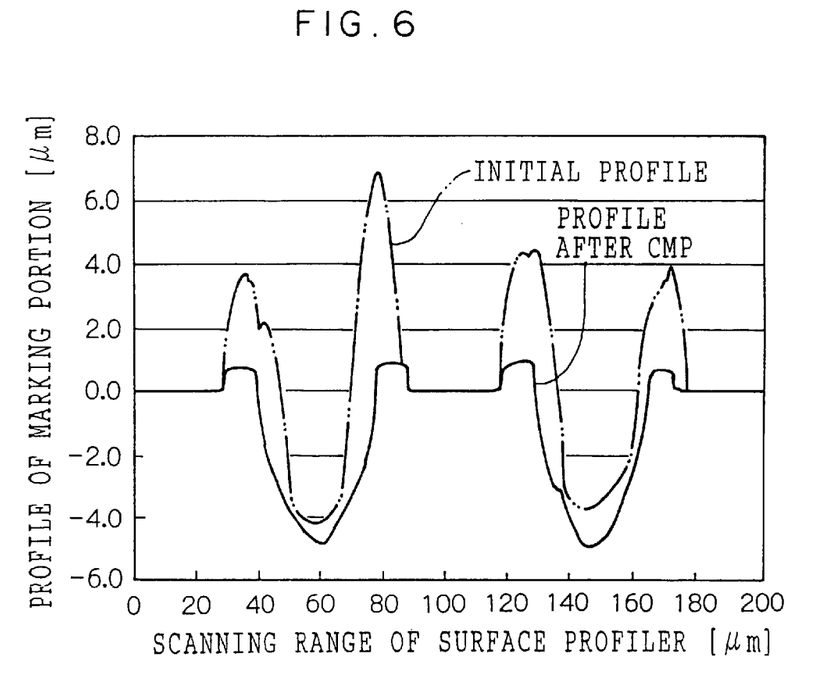
FIG. 6 is a view of a sectional form of the peripheral portion of the wafer measured with a scanning-type surface profiler.

The marking is carried out, for example, by dot printing using a laser (see FIG. 6; hereinafter, a portion in the marking region having such dot prints is referred to as a "marking portion"). FIG. 6 also shows a sectional form of the marking portion after the CMP, and it can be seen that protrusions of about 1 μm in height are still left after the CMP, and openings are widened.

When the wafer having the marking portion as described above is subjected to the CMP, a polishing pressure applied to the wafer from a polishing pad varies at the marking portion and at a peripheral portion thereof, which produces portions which are excessively polished and insufficiently polished. Also in the effective chip region, a polishing pressure applied to effective chips adjacent to the marking region (adjacent effective chips) differs from that applied to other effective chips. That is, the polishing pressure applied to the entire effective chip region is not even. This causes insufficient polishing at the effective chips adjacent to the marking region, and the oxide film on that portion is not removed sufficiently and therefore remains. As a result, when a process to remove the nitride film using hot phosphoric acid in the STI method is carried out, the oxide film acts as a mask, and therefore the nitride film under that is not removed. This is a problem because a complete isolation structure is not obtained.

Now, the above described problem is explained in detail with reference to the figures.

Figure 7A:
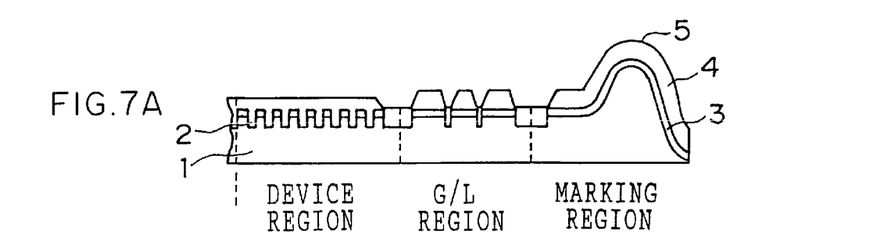
FIGS. 7A–7E are schematic views showing a process of a conventional method for fabricating a semiconductor device using a wafer whose marking region is not subjected to a machining, in which adjacent effective chips are not sufficiently polished and an oxide film is left thereon.

FIG. 7A is a conceptual illustration of a sectional structure in the vicinity of a peripheral portion of a wafer in a state in which a nitride film and an oxide film are formed as described above after a marking is carried out in a marking region of the wafer. This figure shows, as listed from the outermost peripheral portion, a marking region, a grid line (G/L) region, and a device region of effective chips adjacent to the marking region. In FIG. 7A, the reference numeral "1" designates a wafer substrate, "2" designates trenches, "3" designates the nitride film, "4" designates the oxide film and "5" designates a raised portion (protrusion) of a dot of a marking portion (a hole at the center of the dot is not shown).

Figure 7B:
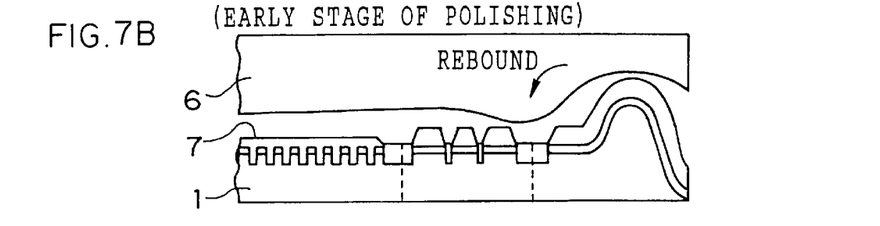

Next, as shown in FIG. 7B, when the wafer is pressed by a polishing pad 6 and polished in a state in which polishing slurry 7 exists between the wafer 1 and the polishing pad 6, the polishing pad elastically deforms to conform to the shape of the protrusion existing on the surface of the wafer. At this time, the polishing pressure is distributed in accordance with an amount of deformation of the pad. The polishing pressure concentrates particularly at the protrusion of the marking portion, and is dispersed and reduced at the peripheral area of the marking portion. At a further outer area thereof, the polishing pressure concentrates because of a rebound of the pad. Then, the polishing pressure is gradually balanced toward the device side.

Therefore, the polishing pressure concentrates at the raised portion produced by the marking and at the rebound portion, while it is reduced at the peripheral area of the marking portion and at the device region (adjacent effective chips).

Figure 7C:
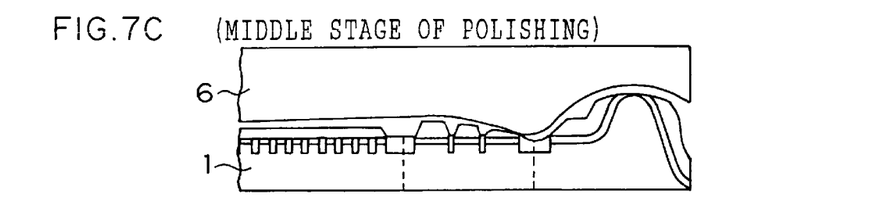

Since a polishing speed of a film varies according to changes of the polishing pressure, it is increased at the protrusion of the marking portion and at the rebound portion, and is reduced at the device region. Consequently, in the middle stage of the polishing, as shown in FIG. 7C, portions which are highly pressed are polished, but the device region is not yet polished. As the polishing proceeds, i.e., together with the reduction of differences in level, the difference in the polishing speed is also reduced. However, once differences in the thickness of the film to be polished between excessively polished regions and insufficiently polished regions have become pronounced, they cannot be reduced.

Figure 7D:
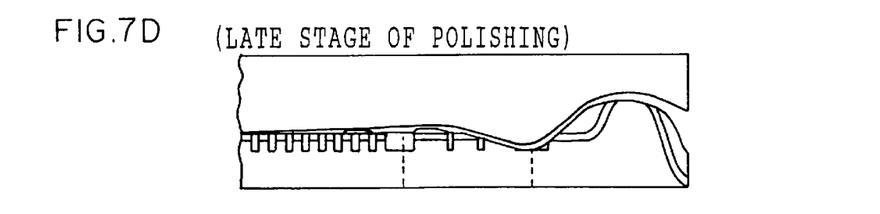
Figure 7E:
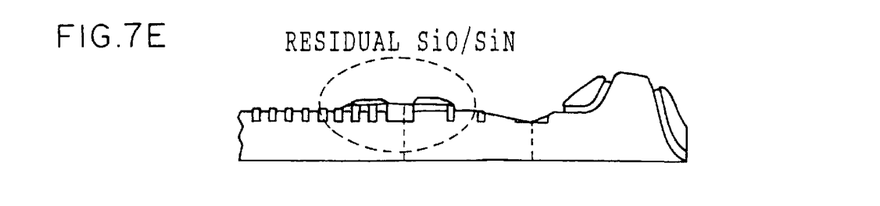

Therefore, in the late stage of the polishing, as shown in FIG. 7D, the difference between the excessively polished regions and the insufficiently polished regions is significant, and a surface of the silicon substrate is exposed at the marking portion, while the oxide film is left at the adjacent effective chip region. Neither are desirable for the STI structure. This residual oxide film causes device defects since the oxide film left at the surface acts as a mask when the nitride film is removed by the hot phosphoric acid treatment after the CMP, and the films (oxide film/nitride film) are locally left (see FIG. 7E).

SUMMARY OF THE INVENTION

In view of the aforementioned, an object of the present invention is to fabricate a semiconductor device having a normal STI structure. The present invention eliminates the problem of insufficient polishing of effective chips adjacent to a marking region of a wafer by improving the environment of the marking region so that a substantially equal polishing pressure is applied to the entire effective chip region at polishing even wherein a conventional marking method is employed.

The above object is accomplished by providing a method for fabricating a semiconductor device having the following aspects.

A first aspect of the present invention is a method for fabricating a semiconductor device having an isolation structure, the method comprising: (a) providing a wafer having a device region including a plurality of chips, a grid line region and a marking region; (b) processing the marking region of the wafer for achieving a substantially equal pressure applied to the chips during surface polishing of the wafer; (c) creating a mark in the marking region; (d) depositing a nitride film on the surface of the wafer, and thereafter an oxide film; and (e) removing the oxide film by polishing the surface of the wafer.

A second aspect of the present invention is a method for fabricating a semiconductor device, the method comprising: (a) preparing a wafer having a device region and a marking region on a surface thereof, wherein the marking region is provided in an inclined portion, at the marking region, at an edge portion of the wafer so that the wafer thickness gradually decreases toward an edge of the wafer; (b) marking at the inclined portion of the marking region; (c) forming an insulating film on the surface of the wafer; and (d) polishing the insulating film.

A third aspect of the present invention is a method for fabricating a semiconductor device, the method comprising: (a) preparing a wafer having a device region and a marking region on a surface thereof, wherein the marking region is provided in a first region on the wafer, the first region having a surface which is lower than the surface of the wafer; (b) marking in the first region; (c) forming an insulating film on the surfaces of the wafer and the first region; and (d) polishing the insulating film.

A fourth aspect of the present invention is a method for fabricating a semiconductor device, the method comprising: (a) preparing a wafer having a device region, a marking region and a groove between the marking region and the device region of the wafer on a surface thereof; (b) creating a mark in the marking region; (c) forming an insulating film on the surface of the wafer; and (d) polishing the insulating film.

As described above, in the method for fabricating a semiconductor device of the present invention, prior to marking onto a wafer, the wafer is subjected to a machining which makes a polishing pressure to be equally applied to effective chips adjacent to a marking region (adjacent effective chips) and other effective chips. Thus a sufficient polishing pressure can be applied to the adjacent effective chips and the entire effective chip region is evenly polished. Thus, the insufficient polishing problem of the adjacent effective chips is eliminated and the oxide film is not left on the adjacent effective chips after the polishing. Therefore, no oxide film/nitride film is left in active regions of the adjacent effective chips, and a semiconductor device having a normal isolation structure can be fabricated.

DESCRIPTION OF THE PREFERRED EMBODIMENTS

In a method for fabricating a semiconductor device of the present invention, prior to marking onto a wafer, a marking region of the wafer is subjected to a machining which enables an equal polishing pressure to be applied to effective chips adjacent to the marking region (adjacent effective chips) and to other effective chips. As described above, in a process for polishing an insulating film such as an oxide film, the adjacent effective chips are not sufficiently polished because a polishing pressure applied to them is smaller than that applied to the other effective chips due to protrusions produced by the marking. However, in the method for fabricating a semiconductor device of the present invention, the marking region of the wafer is subjected to a machining to eliminate the problem of insufficient polishing as described above, and the entire effective chip region can be evenly polished. (While a grid line region exists between the marking region and the adjacent effective chip region, the effective chips which are located nearest to the marking region are referred to as "adjacent effective chips" as noted above.)

The insulating film mentioned above forms isolation regions, and the polishing is carried out, for example, by the Chemical Mechanical Polishing method.

The machining applied to the marking region is not particularly limited as long as it makes a constant polishing pressure to be applied to the entire effective chip region at polishing and can eliminate the problem of insufficient polishing of the adjacent effective chips. Examples of the machining are shown in FIGS. 1A–1D.

Figures 1A, 1B:
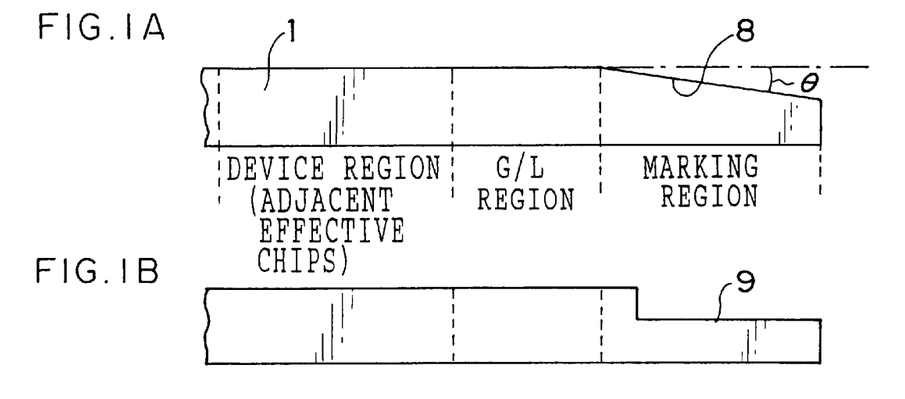
FIGS. 1A–1D are example views of machining applied at a marking region of a wafer.
Figure 1C:
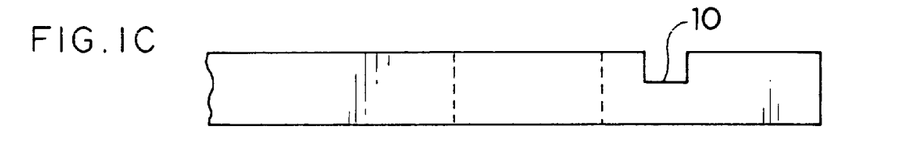
Figure 1D:
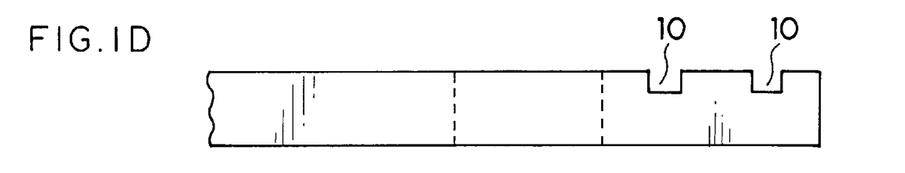

FIG. 1A shows an example in which a marking region is tapered so that a thickness of the wafer is gradually reduced toward an edge of the wafer (a first embodiment described later). An inclined surface is formed at the edge portion of the wafer and a marking is made on this inclined surface. FIG. 1B shows an example in which a marking region is provided with a recessed portion (a second embodiment described later). A first region having a surface which is lower than the surface of the wafer is formed to the wafer, and a marking is made in this first region. The first region may be a plane (a first plane) which is substantially parallel to the surface of the wafer. FIGS. 1C (a third embodiment described later) and 1D (a fourth embodiment described later) illustrate marking regions of wafers which are respectively provided with a groove. In FIGS. 1A–1D, the reference numeral "8" designates the tapered portion, "9" designates the recessed portion, and "10" designates the groove.

Then, after a marking is made on the marking region of the wafer which has been subjected to one of the above described machinings, the so-called STI process is carried out.

In addition, the method for fabricating a semiconductor device having an isolation structure of the present invention further includes an aspect wherein an insulating film is formed on the surface of semiconductor devices after they are formed in the effective chip region (the device region).

Next, a process of polishing an insulating film, which has been formed after a marking has been made in the marking region, is explained. In an embodiment described below, an oxide film is employed as the insulating film, and the CMP (Chemical Mechanical Polishing) method is employed for polishing.

First Embodiment

Figure 2A:
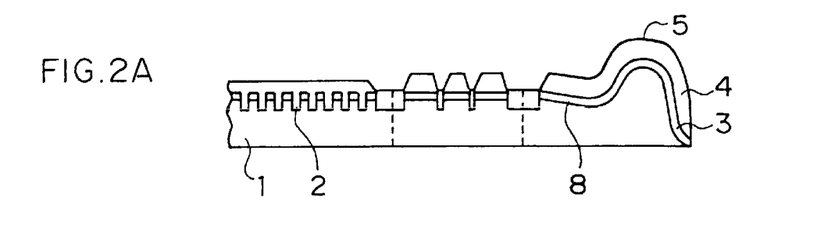
FIGS. 2A–2E are schematic sectional views of a peripheral portion of the wafer at respective steps when the marking region is tapered according to one embodiment of a method for fabricating a semiconductor device of the present invention.

FIGS. 2A–2E illustrate a first embodiment. In this embodiment, a marking region of a wafer is tapered so that a thickness of the wafer is gradually reduced toward an edge of the wafer. That is, an inclined surface is formed at the edge portion of the wafer to thereby compensate for protrusions produced by marking. FIG. 2A illustrates a state in which a nitride film and an oxide film are formed on the surface of the wafer after a marking has been made in the tapered marking region of the wafer. When marking is performed on this tapered marking region under the same marking condition as that in FIG. 7B, although a height of a protrusion from the wafer surface is the same, a relative difference in level between the surface of the device region (reference plane) and the protrusion is smaller when compared to the structure of FIG. 7 which is not subjected to tapering.

Figure 2B:
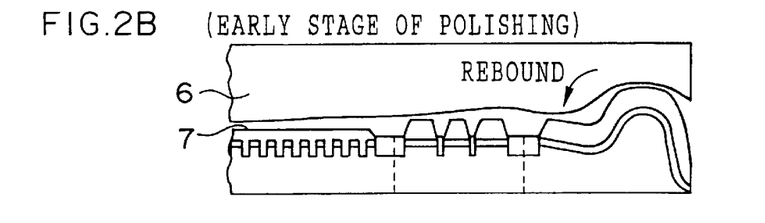
Figure 2C:
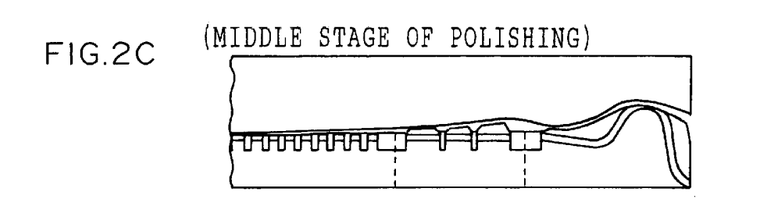
Figure 2D:
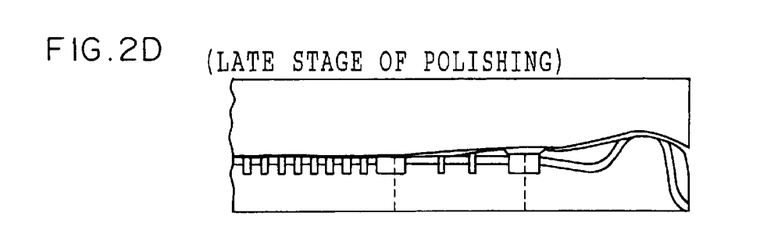

When the CMP is performed on the wafer using a polishing pad as shown in FIG. 2B, although the polishing pad elastically deforms in accordance with differences in the level of the wafer surface, the amount of deformation is smaller when compared to a wafer which is not tapered, and therefore a rebound of the pad due to elastic deformation thereof is reduced.

Thus, the polishing pressure is relatively evenly distributed and local differences in polishing speed are reduced. Therefore, a substantially equal polishing pressure is applied to the chip region adjacent to the marking region and to the other effective chip region, and a decrease in polishing speed at the adjacent chip region is suppressed (see FIG. 2C). The polishing speed at the marking region varies in accordance with the degree of tapering (in turn, a height of a protrusion in the marking region). However, the polishing speed at the device region is sufficiently balanced and therefore the oxide film is not left in the device region (see FIG. 2D).

Figure 2E:
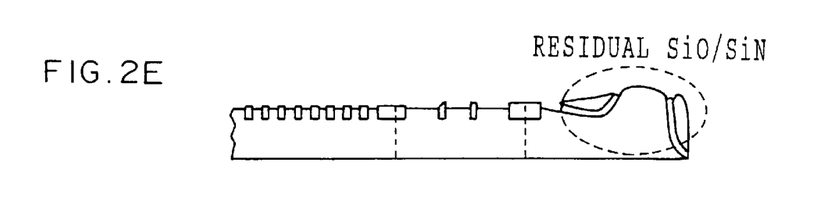

In this embodiment, although residual films (oxide film/nitride film) at the periphery of the marking region are not completely eliminated, the oxide film is not left at the device region, and therefore a good trench isolation structure can be obtained (see FIG. 2E).

Table 1 below shows values for distances (heights) between the surface of the tapered marking region and the surface of the wafer before tapering, which heights are measured at several points along the tapered marking region (these values will hereinafter be respectively referred to as an "amount of fall"). Differences in respective values indicate increases in the distance between the surface of the tapered marking region and the surface of the wafer before tapering as the tapered marking region inclines, or "falls" away from the surface of the wafer before tapering. Here, the marking region is set from the edge of the wafer at a line at least 4 mm removed from the edge of the wafer, and tapering of the marking region is carried out at different degrees (θ, see FIG. 1A) of inclination. In Table 1, "A" is a point 3 mm apart from the edge of the wafer, "B" is 2 mm apart, "C" is 1 mm apart, and "D" is the edge of the wafer. When a tapering is carried out with a θ of 0.2 degrees, an amount of fall of the surface at the point 2 mm apart from the edge of the wafer (the point B) is 6.98 μm. When a mark of 2 mm wide in a longitudinal direction is marked by laser in an area between the point A and the point C (an area between lines respectively 1 mm and 3 mm apart from the edge of the wafer), an average amount of protrusion of the marking portion is about 5 μm.

In a case of marking using a laser, a central portion of a marking dot becomes a hole of about 4 μm depth and a peripheral portion of the hole is raised in a ring shape of about 4–7 μm height, although it depends on the conditions of laser marking.

Therefore, a tapering angle of about 0.2 degrees is sufficient for this type of marking. Since a thickness of the edge of the wafer in this case is 611 μm, which is 625 μm (thickness of the edge of the wafer before tapering when using an eight-inch wafer) minus 13.96 μm (an amount of fall at the point D), this tapering has little effect on the mechanical strength of the edge of the wafer.

Since amounts of protrusions vary depending on marking conditions, a tapering can be carried out with a θ appropriately modified in consideration of an amount of fall which still maintains a sufficient mechanical strength at the point D.

TABLE 1

| Inclination (Θ) | Amount of Fall from Surface (μm) | | | |
|---|---|---|---|---|
| [degrees] | A | B | C | D |
| 0.1 | 1.75 | 3.49 | 5.24 | 6.98 |
| 0.2 | 3.49 | 6.98 | 10.47 | 13.96 |
| 0.4 | 6.98 | 13.96 | 20.94 | 27.93 |
| 0.6 | 10.47 | 20.94 | 31.41 | 41.89 |

D: wafer edge;
C: 1 mm from the edge;
B: 2 mm from the edge;
A: 3 mm from the edge Second Embodiment In a second embodiment, a recessed portion is provided in place of the taper in the first embodiment. In this embodiment, a marking region is provided with a recessed portion to form a first region having a surface which is lower than a surface of a wafer, thereby compensating protrusions produced by marking. A depth of the recessed portion is appropriately determined in consideration of amounts of protrusion on the wafer surface in the marking region produced by marking, and mechanical strength of the edge of the wafer.

Figure 3A:
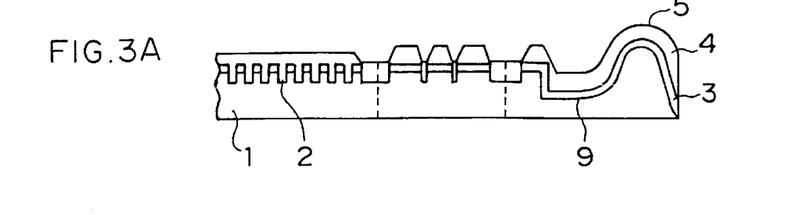
FIGS. 3A–3E are schematic sectional views of another embodiment in which the marking region is provided with a recessed portion.
Figure 3B:
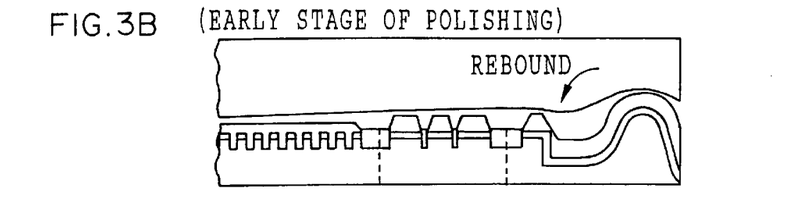
Figure 3C:
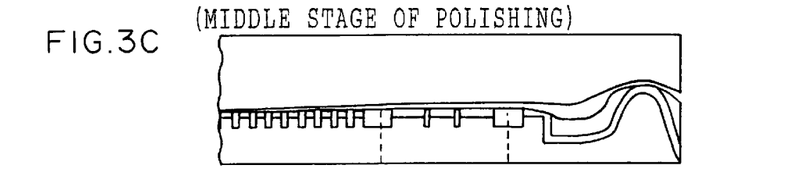
Figure 3D:
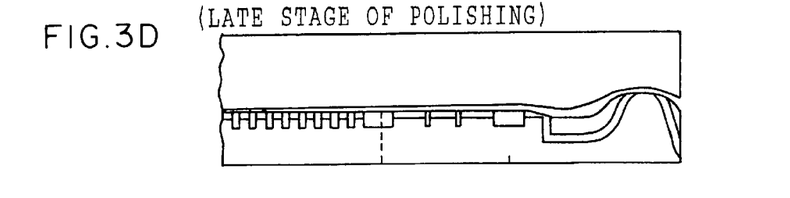

FIG. 3A illustrates a state in which a nitride film and an oxide film are formed on the surface of the wafer after a marking has been made in the recessed portion of the marking region of the wafer. FIGS. 3B–3E schematically illustrate cross-sections of the wafer at respective steps of a marking process and a polishing process for forming a STI structure.

Figure 3E:
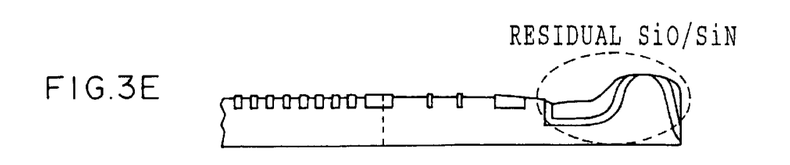

This embodiment also makes a substantially equal polishing pressure to be applied to a chip region adjacent to the marking region and another effective chip region, and a decrease of a polishing speed at a device region is not caused. Further, as shown in FIG. 3E, although the oxide film/nitride film are left at a peripheral area of the marking region, substantially no oxide film/nitride film is left at the device region, and therefore a good STI structure can be obtained. Furthermore, this embodiment can be practiced using commercially available wafers, and the machining of wafers can be carried out with high accuracy even by semiconductor makers.

An appropriate depth of the recessed portion from the surface of the wafer before being recessed is about 4–10 μm, however it may be any depth which can compensate the protrusions produced by marking, and can be appropriately modified within a range in which strength of the wafer is maintained.

Third Embodiment

Figure 4A:
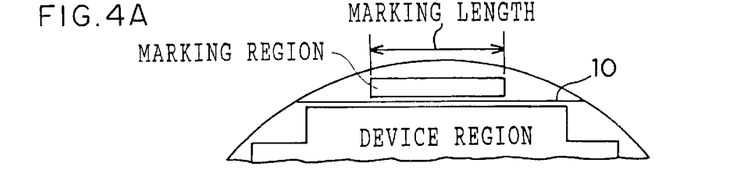
FIGS. 4A–4F are schematic sectional views of yet another embodiment in which the marking region is provided with a groove.
Figure 4B:
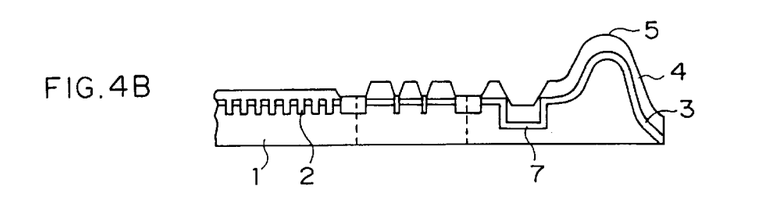

In a third embodiment, a groove is provided between a grid line region and a marking portion of a marking region. FIG. 4A is a partial plan view of a wafer which is provided with a groove at an edge portion thereof. FIGS. 4B–4F schematically illustrate cross-sections of the wafer at respective steps of a polishing process for forming a STI structure. FIG. 4B illustrates a state in which a nitride film and an oxide film are formed on the surface of the wafer after a marking has been made in the groove formed between the marking portion of the marking region and the grid line region of the wafer.

Figure 4C:
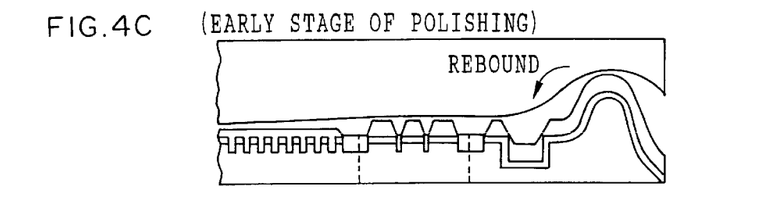
Figure 4D:
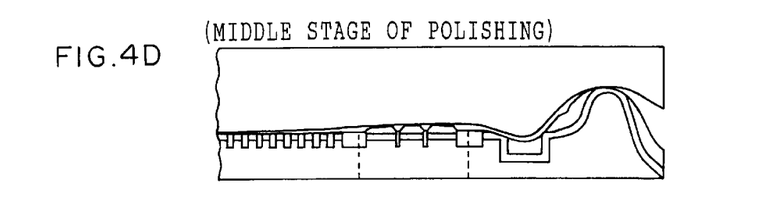
Figure 4E:
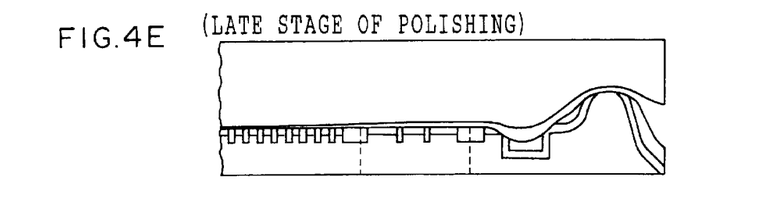

In the early stage of polishing shown in FIG. 4C, a polishing pressure concentrates at a periphery of the marking portion due to a rebound of a polishing pad, while the polishing pressure is reduced in the vicinity of adjacent effective chips. However, in the middle and late stages of polishing as shown in FIGS. 4D and 4E, dishing of the groove portion becomes marked and the polishing pad encroaches upon the groove. Although the polishing pressure is slightly reduced at immediately adjacent portions of the groove due to rebound of the pad, it is increased at the grid line region and the adjacent effective chips, and the polishing speed is increased as well.

Figure 4F:
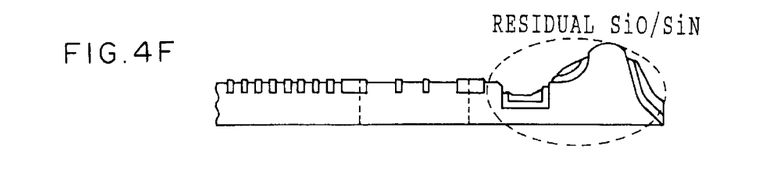

Therefore, after the polishing, no oxide film is left on the adjacent effective chips, no oxide film/nitride film is left at the active region, and therefore a normal STI structure is formed. (Although the oxide film/nitride film are left at the marking portion and the periphery thereof, and in the groove, they cause no problem since they do not affect the electric characteristics of the chips.)

A shape, for example, width, length and depth, of the groove provided in this embodiment is appropriately determined depending on an arrangement pattern of devices formed in the device region, polishing environment characteristics, marking conditions, and the like. The polishing environment characteristics are defined in terms of characteristics of a CMP apparatus to be employed and polishing conditions. Specifically, degrees of influence from an arrangement pattern of adjacent devices are calculated as numerical values by a simulation, and the shape of the groove is determined on the basis of the numerical values.

With regard to the various conditions of this third embodiment, an appropriate width of the groove is about 2–5 mm, and an appropriate depth of the groove is about 5–10 μm. Although location of the groove depends on marking conditions, usually the groove is located at a position about 3–4 mm apart from the edge of the wafer and several hundreds of microns apart from an end of the grid line.

Further, although the groove formed between the marking region and the device region shown in FIG. 4A has a length which almost reaches the edge of the wafer, the length of the groove may be such that the groove is longer than a length of a marking at both sides respectively by at least about 5 mm, that is, a groove having a length which is longer than both ends of a marking at both sides respectively by substantially at least 5 mm is enough in this embodiment.

Fourth Embodiment

Figure 5A:
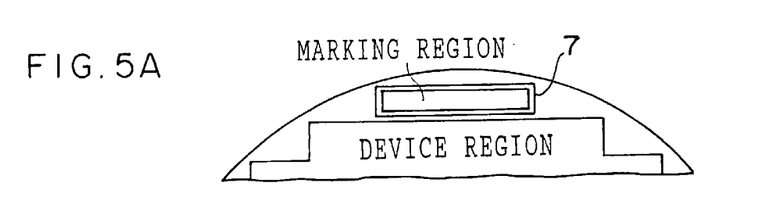
FIGS. 5A and 5B are schematic sectional views of still another embodiment in which the marking region is provided with a groove.
Figure 5B:
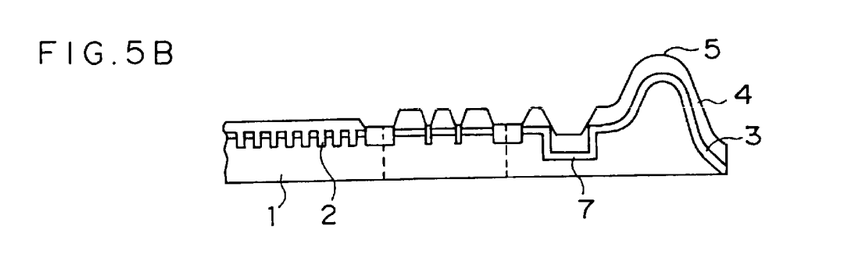

A fourth embodiment is a variation of the third embodiment described above, wherein a groove is provided so as to surround a marking portion instead of being provided between a grid line region and the marking portion of a marking region. FIG. 5A is a partial plan view of a wafer which is provided with a groove 7 surrounding a marking portion in a marking region of the wafer. FIG. 5B illustrates a state in which a nitride film and an oxide film are formed on the surface of the wafer after a marking has been made in the marking portion surrounded by the groove formed in the marking region of the wafer.

A width and a depth of the groove are the same as the third embodiment described above.

In this embodiment, since a length of the groove is shorter than that in the third embodiment and end portions of the groove do not reach an edge of the wafer, the mechanical strength of the wafer is improved as compared to that in the third embodiment, and especially, decrease of strength of a wafer against a high temperature heat treatment can be suppressed. Further, since the groove is provided only at the periphery of the marking portion, there is an additional merit that an effective chip region in a wafer can be increased when compared to the third embodiment (i.e., additional effective chip regions can be provided by the side of the marking portion).

What is claimed is:

1. A method for fabricating a semiconductor device having an isolation structure, the method comprising:
   (a) providing a wafer having a device region including a plurality of chips, a grid line region and a marking region;
   (b) processing the marking region of the wafer for achieving a substantially equal pressure applied to the chips during surface polishing of the wafer;
   (c) creating a mark in the marking region, the creation of the mark causing substrate material to be projected upward in a raised portion adjacent the mark;
   (d) depositing a nitride film on the surface of the wafer, including the raised portion adjacent the mark, and thereafter an oxide film; and
   (e) removing the oxide film by polishing the surface of the wafer, step (e) comprising moving the wafer and a polishing pad relative to one another, the polishing pad being deflected upward during step (e) by the raised portion adjacent the mark.

2. The method according to claim 1, wherein the processing of step (b) includes tapering the marking region of the wafer so that wafer thickness gradually decreases toward an edge of the wafer.

3. The method according to claim 1, wherein the processing of step (b) includes providing a recessed portion in the marking region.

4. A method for fabricating a semiconductor device, the method comprising:
   (a) preparing a wafer having a device region and a marking region on a surface thereof, wherein the marking region is provided in an inclined portion at an edge portion of the wafer so that the wafer thickness gradually decreases toward an edge of the wafer;

(b) creating a mark at the inclined portion of the marking region, the creation of the mark causing substrate material to be projected upward in a raised portion adjacent the mark;

(c) forming an insulating film on the surface of the wafer, including the raised portion adjacent the mark; and (d) polishing the insulating film, step (d) comprising moving the wafer and a polishing pad relative to one another, the polishing pad being deflected upward during step (d) by the raised portion adjacent the mark.

5. The method according to claim 4, wherein a surface of the inclined portion has an inclination of substantially 0.2 degrees with respect to the surface of the wafer.

6. The method according to claim 4, wherein the insulating film forms an isolation structure and the isolation structure is formed by chemical-mechanical polishing.

7. The method according to claim 4, further comprising forming semiconductor devices in the device region.

8. A method for fabricating a semiconductor device, the method comprising:

(a) preparing a wafer having a device region and a marking region on a surface thereof, wherein the marking region is provided in a first region on the wafer, the first region having a surface which is lower than the surface of the wafer;

(b) creating a mark in the first region, the creation of the mark causing substrate material to be projected upward in a raised portion adjacent the mark;

(c) forming an insulating film on the surfaces of the wafer and the first region; and (d) polishing the insulating film, step (d) comprising moving the wafer and a polishing pad relative to one another, the polishing pad being deflected upward during step (d) by the raised portion adjacent the mark.

9. The method according to claim 8, wherein the surface of the first region is substantially parallel to the surface of the wafer.

10. The method according to claim 9, wherein the surface of the first region is at least 4 $\mu$m lower than the surface of the wafer.

11. The method according to claim 8, wherein the insulating film forms an isolation structure and the isolation structure is formed by chemical-mechanical polishing.

12. The method according to claim 8, further comprising forming semiconductor devices in the device region.

* * * * *

UNITED STATES PATENT AND TRADEMARK OFFICE
CERTIFICATE OF CORRECTION

PATENT NO. : 6,660,617 B2
DATED : December 9, 2003
INVENTOR(S) : Hiroyuki Kawano It is certified that error appears in the above-identified patent and that said Letters Patent is hereby corrected as shown below:

<u>Title page,</u>
Item [56], References Cited, FOREIGN PATENT DOCUMENTS, insert
-- JP    2000-286173    10/13/00 --

Signed and Sealed this

Twenty-seventh Day of July, 2004

JON W. DUDAS
*Acting Director of the United States Patent and Trademark Office*